United States Patent
Huang et al.

(10) Patent No.: US 11,023,023 B2
(45) Date of Patent: Jun. 1, 2021

(54) START-AND-STOP DETECTING APPARATUS AND METHOD FOR I³C BUS

(71) Applicant: FARADAY TECHNOLOGY CORPORATION, Hsinchu (TW)

(72) Inventors: Kun-Hua Huang, Hsinchu (TW); Chang-Chin Chung, Hsinchu (TW); Kun-Chih Chen, Hsinchu (TW)

(73) Assignee: FARADAY TECHNOLOGY CORPORATION, Hsinchu (TW)

( * ) Notice: Subject to any disclaimer, the term of this patent is extended or adjusted under 35 U.S.C. 154(b) by 16 days.

(21) Appl. No.: 16/709,021

(22) Filed: Dec. 10, 2019

(65) Prior Publication Data

US 2021/0048861 A1    Feb. 18, 2021

(30) Foreign Application Priority Data

Aug. 13, 2019 (TW) ................. 108128717

(51) Int. Cl.
*G06F 1/24* (2006.01)
*G06F 13/42* (2006.01)
*G06F 1/04* (2006.01)
*H03K 19/20* (2006.01)

(52) U.S. Cl.
CPC .............. *G06F 1/24* (2013.01); *G06F 1/04* (2013.01); *G06F 13/4291* (2013.01); *H03K 19/20* (2013.01)

(58) Field of Classification Search
CPC .......... G06F 1/24; G06F 1/04; G06F 13/4282; G06F 13/4291; H03K 19/20
See application file for complete search history.

(56) References Cited

U.S. PATENT DOCUMENTS

| 6,530,029 | B1* | 3/2003 | Metchev ............. G06F 13/4291 |
| | | | 713/400 |
| 7,174,473 | B2* | 2/2007 | Musumeci ........... H03K 5/1252 |
| | | | 713/400 |
| 8,878,569 | B1* | 11/2014 | Fullerton ........... H03K 19/0021 |
| | | | 326/94 |
| 2018/0131375 | A1 | 5/2018 | Endersen et al. |
| 2020/0167301 | A1* | 5/2020 | Matsumoto ......... G06F 13/3625 |

OTHER PUBLICATIONS

Office Action issued by Taiwan Intellectual Property Office dated Jul. 3, 2020.

* cited by examiner

*Primary Examiner* — Brian T Misiura
(74) *Attorney, Agent, or Firm* — WPAT, PC

(57) ABSTRACT

A start-and-stop detecting apparatus for an I³C bus is provided. The start-and-stop detecting apparatus is connected with a serial data line and a serial clock line. The start-and-stop detecting apparatus includes a first start detecting circuit, a second start detecting circuit and a first OR gate. The first start detecting circuit receives a data signal, a clock signal and a reset signal, and generates a first control signal and a first output signal. The second start detecting circuit receives the data signal, the clock signal, the reset signal and the first control signal, and generates a second output signal. A first input terminal of the first OR gate receives the first output signal. A second input terminal of the first OR gate receives the second output signal. An output terminal of the first OR gate generates a start signal.

12 Claims, 5 Drawing Sheets

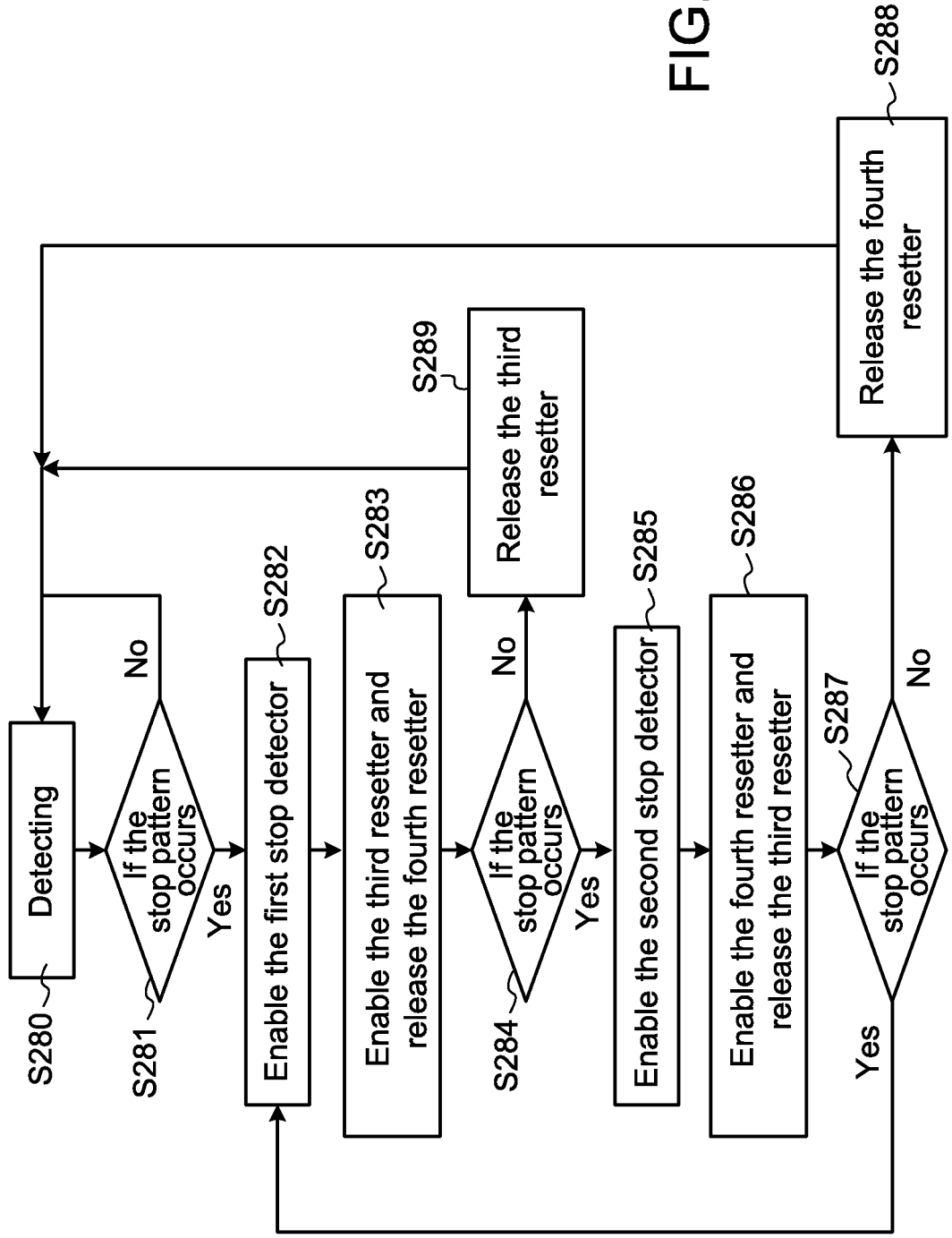

START-AND-STOP DETECTING APPARATUS AND METHOD FOR I³C BUS

This application claims the benefit of Taiwan Patent Application No. 108128717, filed Aug. 13, 2019, the subject matter of which is incorporated herein by reference.

FIELD OF THE INVENTION

The present invention relates to a detecting apparatus and a detecting method, and more particularly to a start-and-stop detecting apparatus and a start-and-stop detecting method for an I³C bus.

BACKGROUND OF THE INVENTION

An inter-integrated circuit bus (also abbreviated as an I²C bus) is a serial communication bus. The I²C bus comprises a serial data line and a serial clock line. The I²C bus is connected with plural master devices and plural slave devices. These master devices and these slave devices can transfer data through the I²C bus.

FIG. 1 is a schematic waveform diagram illustrating associated signals through a conventional I²C bus. This technology is disclosed in U.S. Pat. No. 6,530,029.

At the time point t1, the clock signal SCL in the high level state, and the data signal SDA is switched from the high level state to the low level state. Meanwhile, the start pattern of the clock signal SCL and the data signal SDA occurs. Consequently, the I²C bus starts to transfer data.

At the time point t2 corresponding to the negative edge of the clock signal SCL, the detecting circuit of the slave device generates a start signal START. Meanwhile, the slave device begins the data reception.

At the time point t3 corresponding to the positive edge of the clock signal SCL, the slave device latches the data signal SDA according to the clock signal SCL. During the data reception, the level state of the data signal SDA is determined according to the level state of the clock signal SCL. For example, the level state of the data signal SDA is switched when the clock signal SCL is in the low level state, and the level state of the data signal SDA is kept unchanged when the clock signal SCL is in the low level state.

At the t4, the clock signal SCL in the high level state, and the data signal SDA is switched from the low level state to the positive edge of the high level state. Meanwhile, the stop pattern of the clock signal SCL and the data signal SDA occurs. Consequently, the I²C bus stops transferring data. The detecting circuit of the slave device generates a stop signal STOP. Meanwhile, the slave device stops the data reception.

Recently, an I³C bus is an evolution of I²C bus. That is, the I³C bus is developed on the basis of the I²C bus. The I³C bus also comprises a serial data line and a serial clock line. The I³C bus retains the upward compatibility with the existing I²C bus. That is, the master devices and the slave devices connected with the I³C bus may communicate with each other according to the operations of the I²C bus.

According to the specifications of the I³C bus, the level state of the data signal SDA starts to change when the I³C bus starts to transfer data and at the time point corresponding to a first negative edge of the clock signal SCL.

Take the waveform as shown in FIG. 1 for example. According to the specifications of the I³C bus, the level state of the data signal SDA starts to change at the earlier time point (e.g., t2). Meanwhile, the slave device begins the data reception. However, since the detecting circuit generates the start signal START at the time point t2, the core circuit of the slave device has no safe setup time and hold time to latch the start signal START. Since the slave device is possibly unable to receive a first bit of the data signal SDA, the slave device is suffered from the malfunction.

According to the specifications of the I³C bus, plural start patterns may be generated in the I³C bus in the time interval between the start pattern and the stop pattern. These start patterns are referred as repeat start patterns. Similarly, plural stop patterns may be generated in the I³C bus in the time interval between the stop pattern and the start pattern. These stop patterns are referred as repeat stop patterns. In other words, the start signal and the stop signal from the detecting circuit need to indicate the repeat start patterns and the repeat stop patterns. Consequently, the malfunction of the slave device is avoided.

SUMMARY OF THE INVENTION

An embodiment of the present invention provides a start-and-stop detecting apparatus for an I³C bus. The start-and-stop detecting apparatus is connected with a serial data line and a serial clock line. The start-and-stop detecting apparatus includes a first start detecting circuit, a second start detecting circuit and a first OR gate. The first start detecting circuit receives a data signal from the serial data line, a clock signal from the serial clock line and a reset signal from a reset line, and generates a first control signal and a first output signal. The second start detecting circuit receives the data signal, the clock signal, the reset signal and the first control signal, and generates a second output signal. A first input terminal of the first OR gate receives the first output signal. A second input terminal of the first OR gate receives the second output signal. An output terminal of the first OR gate generates a start signal.

Another embodiment of the present invention provides a start detecting method for a detecting apparatus. The detecting apparatus is connected with an I³C bus. The detecting apparatus includes a first start detector, a first resetter, a second start detector and a second resetter to receive a clock signal and a data signal. The start detecting method includes the following steps. In a step (a1), the clock signal and the data signal are detected. Then, a step (a2) is performed to judge whether a start pattern of the clock signal and the data signal occur. If the start pattern of the clock signal and the data signal occurs, the first start detector is enabled. If the start pattern of the clock signal and the data signal does not occur, the step (a1) is repeatedly done. In a step (a3), the first resetter is enabled, and the second resetter is released by the second start detector. Then, a step (a4) is performed to judge whether the start pattern of the clock signal and the data signal occur. If the start pattern of the clock signal and the data signal occurs, the second start detector is enabled. If the start pattern of the clock signal and the data signal does not occur, the first resetter is released by the first start detector and the step (a1) is repeatedly done. In a step (a5), the second resetter is enabled, and the first resetter is released by the first start detector. Then, a step (a6) is performed to judge whether the start pattern of the clock signal and the data signal occur, wherein if the start pattern of the clock signal and the data signal occurs, the first start detector is enabled and the step (a3) is repeatedly done. If the start pattern of the clock signal and the data signal does not occur, the second resetter is released by the second start detector and the step (a1) is repeatedly done.

A further embodiment of the present invention provides a stop detecting method for a detecting apparatus. The detecting apparatus is connected with an I³C bus. The detecting apparatus includes a first stop detector, a first resetter, a second stop detector and a second resetter to receive a clock signal and a data signal. The stop detecting method includes the following steps. In a step (b1), the clock signal and the data signal are detected. Then, a step (b2) is performed to judge whether a stop pattern of the clock signal and the data signal occur. If the stop pattern of the clock signal and the data signal occurs, the first stop detector is enabled. If the stop pattern of the clock signal and the data signal does not occur, the step (b1) is repeatedly done. In a step (b3), the first resetter is enabled, and the second resetter is released by the second stop detector. Then, a step (b4) is performed to judge whether the stop pattern of the clock signal and the data signal occur. If the stop pattern of the clock signal and the data signal occurs, the second stop detector is enabled. If the stop pattern of the clock signal and the data signal does not occur, the first resetter is released by the first stop detector and the step (b1) is repeatedly done. In a step (b5), the second resetter is enabled, and the first resetter is released by the first stop detector. Then, a step (b6) is performed to judge whether the stop pattern of the clock signal and the data signal occur, wherein if the stop pattern of the clock signal and the data signal occurs, the first stop detector is enabled and the step (b3) is repeatedly done. If the stop pattern of the clock signal and the data signal does not occur, the second resetter is released by the second stop detector and the step (b1) is repeatedly done.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 4C is a flowchart illustrating the operations of the first stop detecting circuit and the second stop detecting circuit of the stop-and-stop detecting apparatus according to the embodiment of the present invention.

DETAILED DESCRIPTION OF PREFERRED EMBODIMENTS

Figure 1:
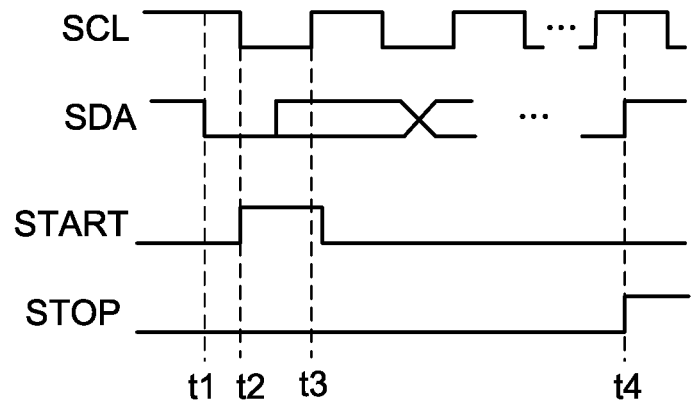
FIG. 1 (prior art) is a schematic waveform diagram illustrating associated signals through a conventional I²C bus.
Figure 2:
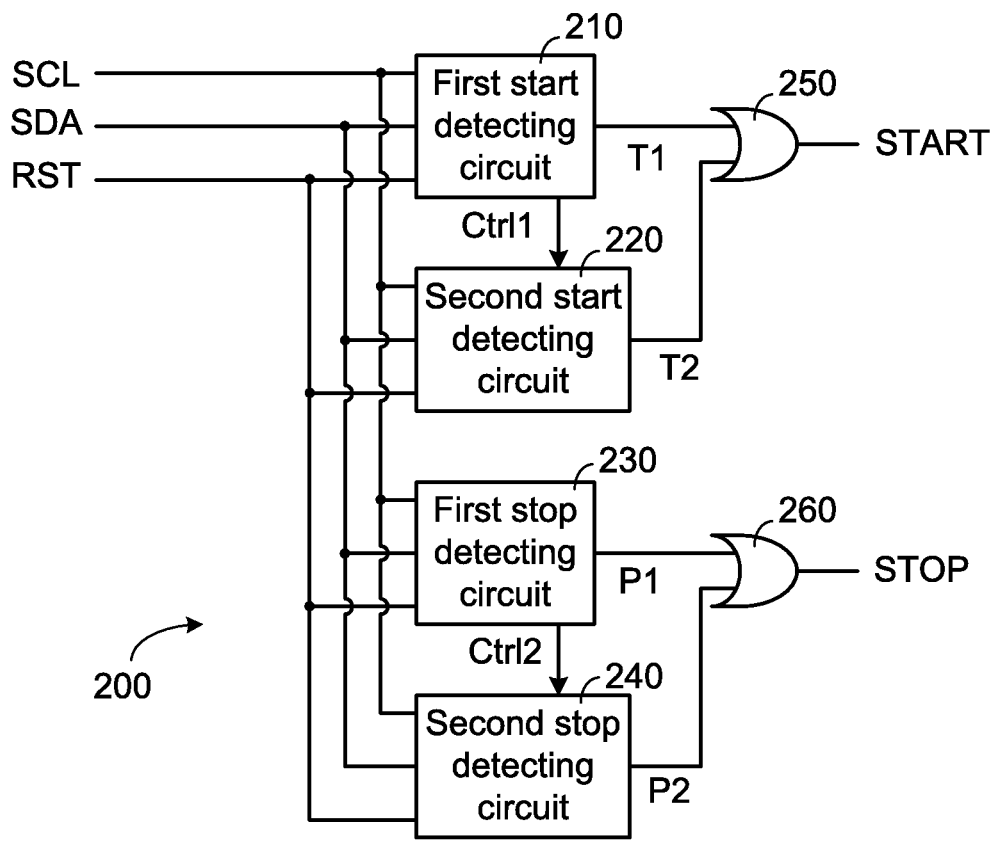
FIG. 2 is a schematic circuit diagram illustrating a start-and-stop detecting apparatus according to an embodiment of the present invention.

FIG. 2 is a schematic circuit diagram illustrating a start-and-stop detecting apparatus according to an embodiment of the present invention. As shown in FIG. 2, the start-and-stop detecting apparatus 200 comprises a first start detecting circuit 210, a second start detecting circuit 220, a first stop detecting circuit 230, a second stop detecting circuit 240, an OR gate 250 and an OR gate 260.

The first start detecting circuit 210 is connected with a serial data line, a serial clock line and a reset line to receive a data signal SDA, a clock signal SCL and a reset signal RST. Moreover, the first start detecting circuit 210 generates a first output signal T1 and a first control signal Ctrl1.

The second start detecting circuit 220 is connected with the serial data line, the serial clock line and the reset line to receive the data signal SDA, the clock signal SCL and the reset signal RST. The second start detecting circuit 220 further receives the first control signal Ctrl1. The second start detecting circuit 220 generates a second output signal T2. Moreover, the OR gate 250 receives the first output signal T1 and the second output signal T2, and generates a start signal START.

The first stop detecting circuit 230 is connected with the serial data line, the serial clock line and the reset line to receive the data signal SDA, the clock signal SCL and the reset signal RST. Moreover, the first stop detecting circuit 230 generates a third output signal P1 and a second control signal Ctrl2.

The second stop detecting circuit 240 is connected with the serial data line, the serial clock line and the reset line to receive the data signal SDA, the clock signal SCL and the reset signal RST. The second stop detecting circuit 240 further receives the second control signal Ctrl2. The second stop detecting circuit 240 generates a fourth output signal P2. Moreover, the OR gate 260 receives the third output signal P1 and the fourth output signal P2, and generates a stop signal STOP.

Figure 3A:
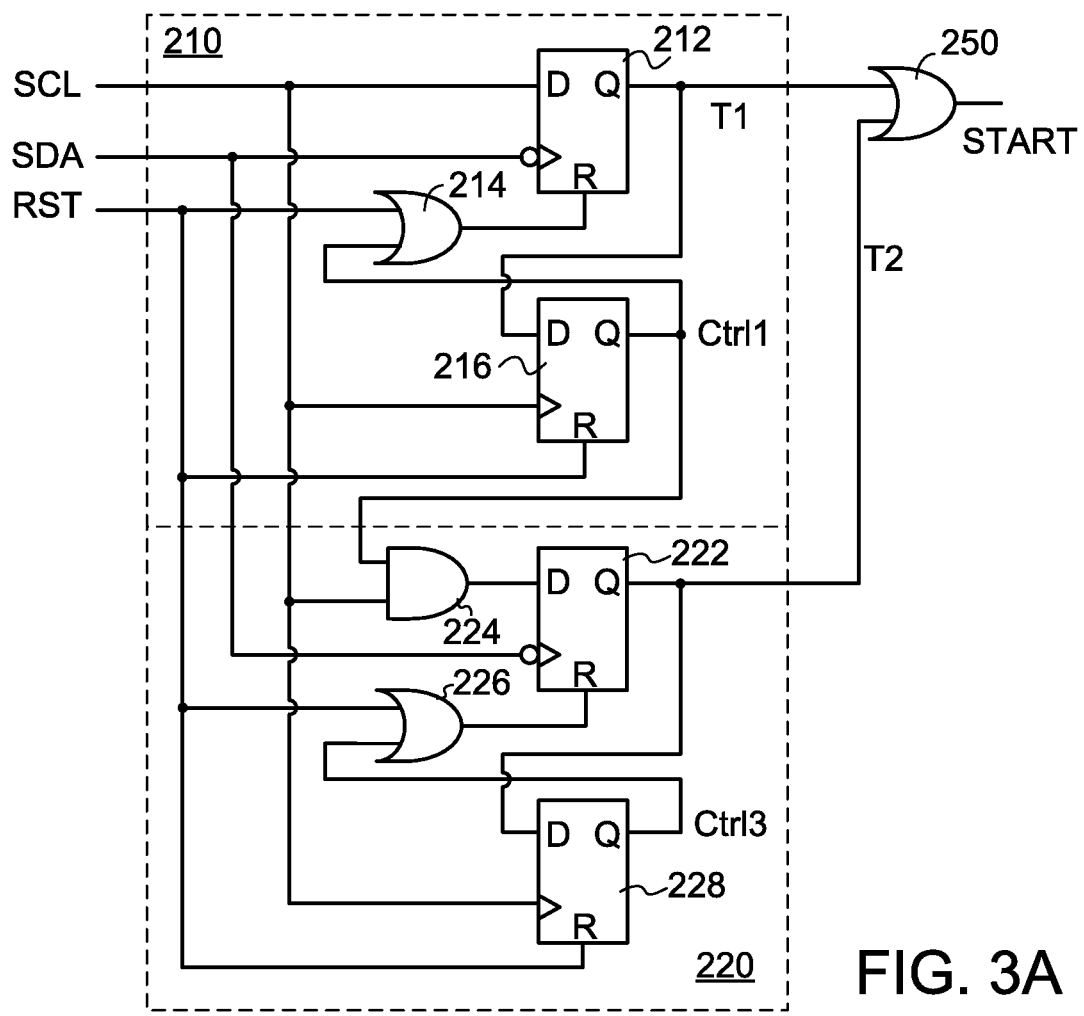
FIG. 3A is a schematic circuit diagram illustrating the detailed circuitries of the first start detecting circuit and the second start detecting circuit of the start-and-stop detecting apparatus according to the embodiment of the present invention.

FIG. 3A is a schematic circuit diagram illustrating the detailed circuitries of the first start detecting circuit and the second start detecting circuit of the start-and-stop detecting apparatus according to the embodiment of the present invention. The first start detecting circuit 210 comprises a first start detector 212, a first resetter 216 and an OR gate 214. The second start detecting circuit 220 comprises a second start detector 222, a second resetter 228, an AND gate 224 and an OR gate 226. In an embodiment, the first start detector 212 and the second start detector 222 are negative edge-triggered D flip-flops, and the first resetter 216 and the second resetter 228 are positive edge-triggered D flip-flops.

A data input terminal D of the first start detector 212 receives the clock signal SCL. A clock input terminal of the first start detector 212 receives the data signal SDA. A data output terminal Q of the first start detector 212 generates the first output signal T1.

A data input terminal D of the first resetter 216 receives the first output signal T1. A clock input terminal of the first resetter 216 receives the clock signal SCL. A data output terminal Q of the first resetter 216 generates the first control signal Ctrl1. A reset terminal R of the first resetter 216 receives the reset signal RST.

The two input terminals of the OR gate 214 receive the reset signal RST and the first control signal Ctrl1, respectively. Moreover, an output terminal of the OR gate 214 is connected with the reset terminal R of the first start detector 212.

The two input terminals of the AND gate 224 receive the clock signal SCL and the first control signal Ctrl1, respectively. An output terminal of the AND gate 224 is connected with a data input terminal D of the second start detector 222.

A clock input terminal of the second start detector 222 receives the data signal SDA. A data output terminal Q of the second start detector 222 generates the second output signal T2.

A data input terminal D of the second resetter 228 receives the second output signal T2. A clock input terminal of the second resetter 228 receives the clock signal SCL. A reset terminal R of the second resetter 228 receives the reset signal RST. A data output terminal Q of the second resetter 228 generates a third control signal Ctrl3 to an input terminal of the OR gate 226.

Another input terminal of the OR gate 226 receives the reset signal RST. An output terminal of the OR gate 226 is connected with the reset terminal R of the second start detector 222.

Figure 3B:
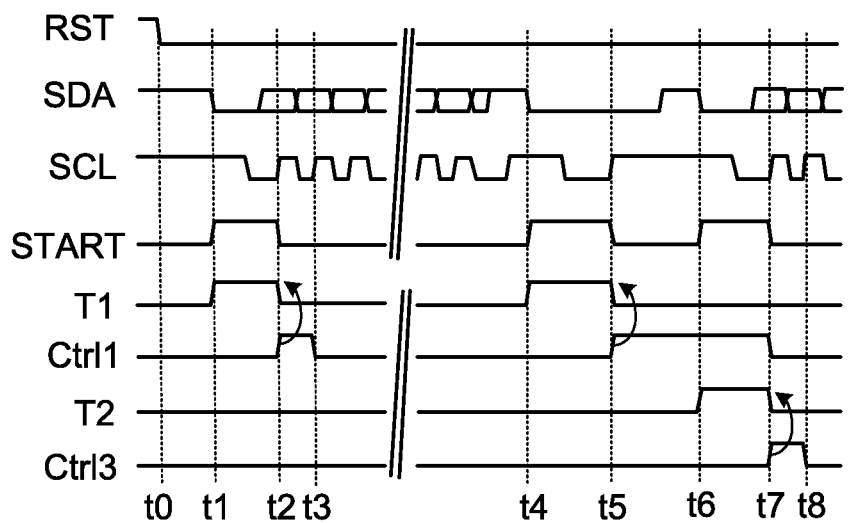
FIG. 3B is a schematic waveform diagram illustrating associated signals processed by the first start detecting circuit and the second start detecting circuit of the start-and-stop detecting apparatus according to the embodiment of the present invention.
Figure 3C:
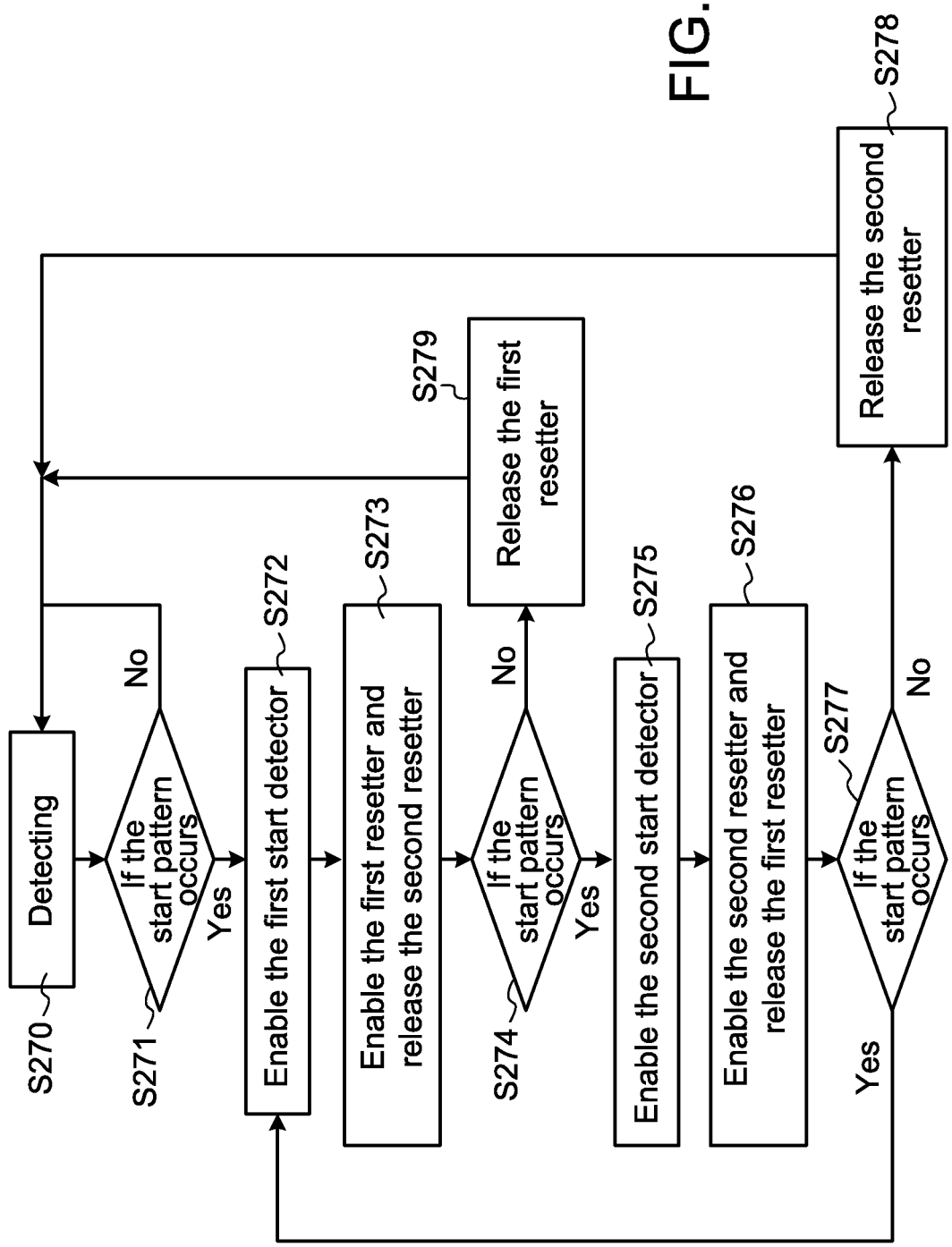
FIG. 3C is a flowchart illustrating the operations of the first start detecting circuit and the second start detecting circuit of the start-and-stop detecting apparatus according to the embodiment of the present invention.

FIG. 3B is a schematic waveform diagram illustrating associated signals processed by the first start detecting circuit and the second start detecting circuit of the start-and-stop detecting apparatus according to the embodiment of the present invention. FIG. 3C is a flowchart illustrating the operations of the first start detecting circuit and the second start detecting circuit of the start-and-stop detecting apparatus according to the embodiment of the present invention.

After the time point t0, the reset signal RST is in the low level state, and the first start detecting circuit 210 and the second start detecting circuit 220 start to detect the clock signal SCL and the data signal SDA. That is, the step S270 is performed.

At the time point t1, the start pattern of the clock signal SCL and the data signal SDA occurs (Step S271). Meanwhile, the first start detector 212 is enabled (Step S272). Consequently, the first output signal T1 is switched from the low level state to the high level state.

At the time point t2 corresponding to the positive edge of the clock signal SCL, the first resetter 216 is enabled (Step S273). Consequently, the first control signal Ctrl1 is switched from the low level state to the high level state. Moreover, the first control signal Ctrl1 is transmitted to the first start detector 212 through the OR gate 214. Then, the first start detector 212 is reset, and the first output signal T1 is switched from the high level state to the low level state. Moreover, since the second output signal T2 is in the low level state, the second start detector 222 releases the second resetter 228 (Step S273). After the second resetter 228 is released, the second start detector 222 is operated according to the signal at the data input terminal D of the second start detector 222.

At the time point t3 corresponding to the positive edge of the clock signal SCL, the start pattern of the clock signal SCL and the data signal SDA does not occur (Step S274). Since the first output signal T1 is in the low level state, the first start detector 212 releases the first resetter 216 (Step S279). After the first resetter 216 is released, the first start detector 212 is operated according to the clock signal SCL at the data input terminal D of the first start detector 212. Then, the step S270 is repeatedly done.

At the time point t4, the start pattern of the clock signal SCL and the data signal SDA occurs (Step S271). Meanwhile, the first start detector 212 is enabled (Step S272). Consequently, the first output signal T1 is switched from the low level state to the high level state.

At the time point t5 corresponding to the positive edge of the clock signal SCL, the first resetter 216 is enabled (Step S273). Consequently, the first control signal Ctrl1 is switched from the low level state to the high level state. Moreover, the first control signal Ctrl1 is transmitted to the first start detector 212 through the OR gate 214. Then, the first start detector 212 is reset, and the first output signal T1 is switched from the high level state to the low level state. Moreover, since the second output signal T2 is in the low level state, the second start detector 222 releases the second resetter 228 (Step S273).

At the time point t6, the start pattern of the clock signal SCL and the data signal SDA occurs (Step S274). Meanwhile, the second start detector 222 is enabled (Step S275). Consequently, the second output signal T2 is switched from the low level state to the high level state.

At the time point t7 corresponding to the positive edge of the clock signal SCL, the second resetter 228 is enabled (Step S276). Meanwhile, the third control signal Ctrl3 is switched from the low level state to the high level state. Moreover, the third control signal Ctrl3 is transmitted to the second start detector 222 through the OR gate 226. Meanwhile, the second start detector 222 is reset, and the second output signal T2 is switched from the high level state to the low level state. Since the first output signal T1 is in the low level state, the first start detector 212 releases the first resetter 216 (Step S276).

At the time point t8 corresponding to the positive edge of the clock signal SCL, the start pattern of the clock signal SCL and the data signal SDA does not occur (Step S277). Since the second output signal T2 is in the low level state, the second start detector 222 releases the second resetter 228 (Step S278). Then, the step S270 is repeatedly done.

The operations of the first start detecting circuit and the second start detecting circuit have been described as above. When the start pattern of the clock signal SCL and the data signal SDA occurs, the cooperation of the OR gate 250 and the output signals T1, T2 can generate the start signal START to indicate the start pattern and the repeat start patterns of the clock signal SCL and the data signal SDA.

When the start pattern occurs, the core circuit of the slave device connected with the I$^3$C bus can latch the start signal START according to the negative edge of the clock signal SCL. Consequently, the slave device can be operated normally.

Figure 4A:
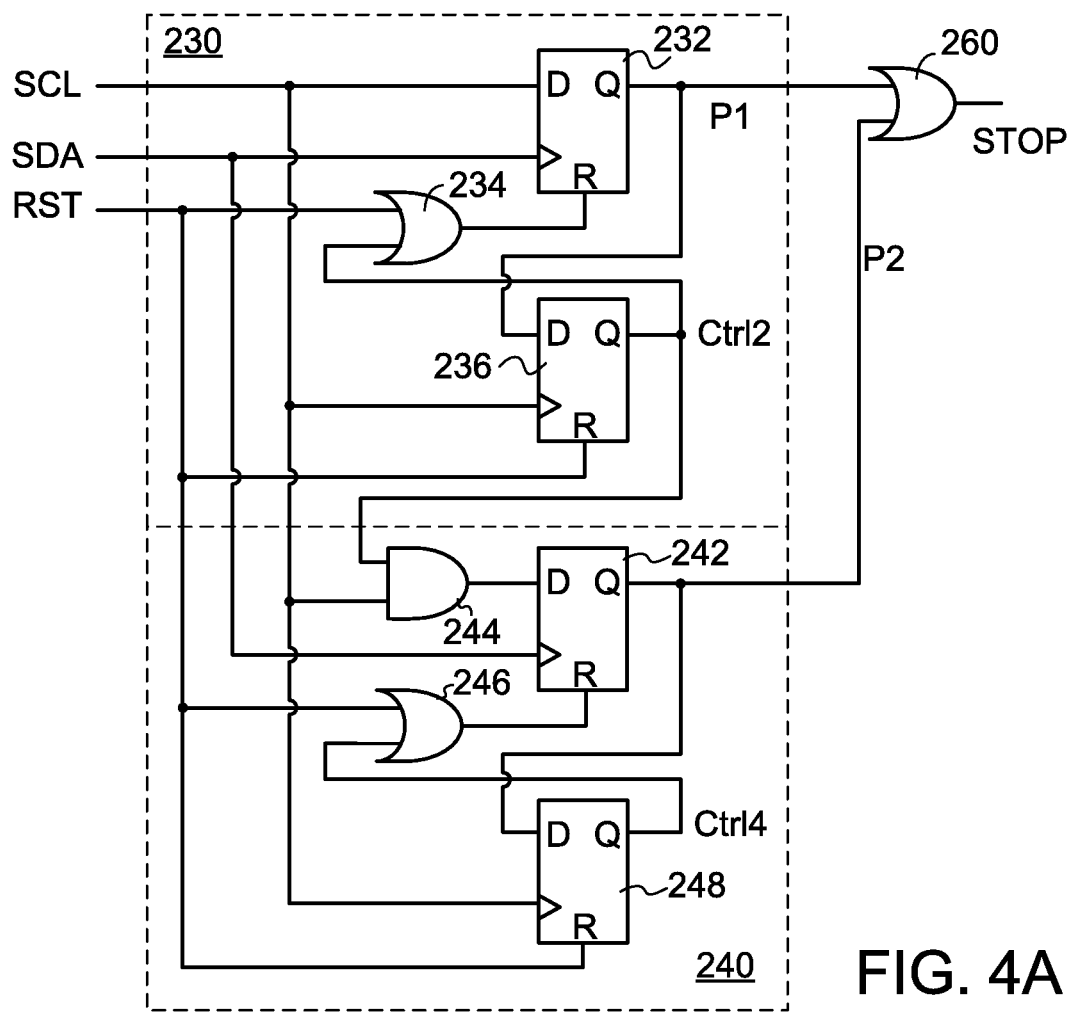
FIG. 4A is a schematic circuit diagram illustrating the detailed circuitries of the first stop detecting circuit and the second stop detecting circuit of the stop-and-stop detecting apparatus according to the embodiment of the present invention.

FIG. 4A is a schematic circuit diagram illustrating the detailed circuitries of the first stop detecting circuit and the second stop detecting circuit of the stop-and-stop detecting apparatus according to the embodiment of the present invention. The first stop detecting circuit 230 comprises a first stop detector 232, a third resetter 236 and an OR gate 234. The second stop detecting circuit 240 comprises a second stop detector 242, a fourth resetter 248, an AND gate 244 and an OR gate 246. In an embodiment, the first stop detector 232 and the second stop detector 242, the third resetter 236 and the fourth resetter 248 are positive edge-triggered D flip-flops.

A data input terminal D of the first stop detector 232 receives the clock signal SCL. A clock input terminal of the first stop detector 232 receives the data signal SDA. A data output terminal Q of the first stop detector 232 generates the third output signal P1.

A data input terminal D of the third resetter 236 receives the third output signal P1. A clock input terminal of the third resetter 236 receives the clock signal SCL. A data output terminal Q of the third resetter 236 generates the second control signal Ctrl2. A reset terminal R of the third resetter 236 receives the reset signal RST.

The two input terminals of the OR gate 234 receive the reset signal RST and the second control signal Ctrl2, respectively. Moreover, an output terminal of the OR gate 234 is connected with the reset terminal R of the first stop detector 232.

The two input terminals of the AND gate 244 receive the clock signal SCL and the second control signal Ctrl2, respectively. An output terminal of the AND gate 244 is connected with a data input terminal D of the second stop detector 242.

A clock input terminal of the second stop detector 242 receives the data signal SDA. A data output terminal Q of the second stop detector 242 generates the fourth output signal P2.

A data input terminal D of the fourth resetter 248 receives the fourth output signal P2. A clock input terminal of the fourth resetter 248 receives the clock signal SCL. A reset terminal R of the fourth resetter 248 receives the reset signal RST. A data output terminal Q of the fourth resetter 248 generates a fourth control signal Ctrl4 to an input terminal of the OR gate 246.

Another input terminal of the OR gate 246 receives the reset signal RST. An output terminal of the OR gate 246 is connected with the reset terminal R of the second stop detector 242.

Figure 4B:
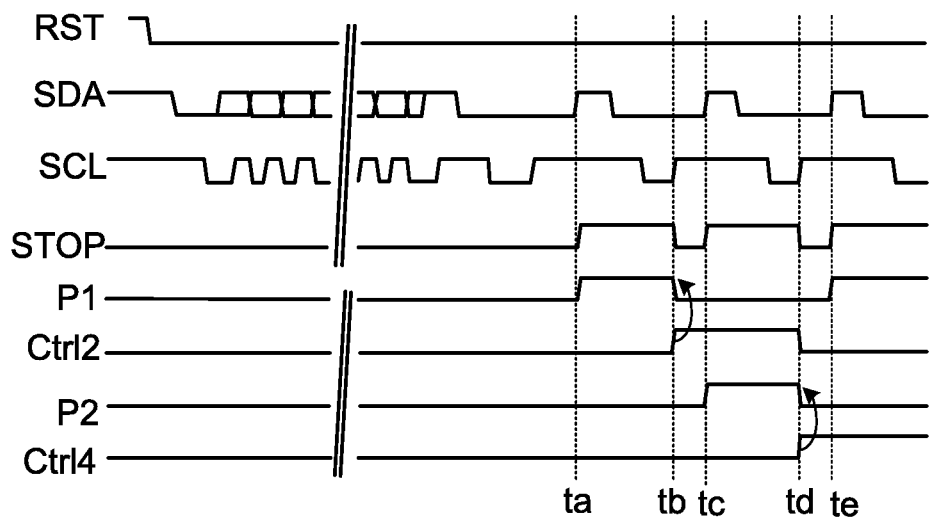
FIG. 4B is a schematic waveform diagram illustrating associated signals processed by the first stop detecting circuit and the second stop detecting circuit of the stop-and-stop detecting apparatus according to the embodiment of the present invention.

FIG. 4B is a schematic waveform diagram illustrating associated signals processed by the first stop detecting circuit and the second stop detecting circuit of the stop-and-stop detecting apparatus according to the embodiment of the present invention. FIG. 4C is a flowchart illustrating the operations of the first stop detecting circuit and the second stop detecting circuit of the stop-and-stop detecting apparatus according to the embodiment of the present invention.

At the time point ta, the stop pattern of the clock signal SCL and the data signal SDA occurs (Step S281). Meanwhile, the first stop detector 232 is enabled (Step S282). Consequently, the third output signal P1 is switched from the low level state to the high level state.

At the time point tb corresponding to the positive edge of the clock signal SCL, the third resetter 236 is enabled (Step S283). Consequently, the second control signal Ctrl2 is switched from the low level state to the high level state. Moreover, the second control signal Ctrl2 is transmitted to the first stop detector 232 through the OR gate 234. Then, the first stop detector 232 is reset, and the third output signal P1 is switched from the high level state to the low level state. Moreover, since the fourth output signal P2 is in the low level state, the second stop detector 242 releases the fourth resetter 248 (Step S283). After the fourth resetter 248 is released, the second stop detector 242 is operated according to the signal at the data input terminal D of the second stop detector 242.

At the time point tc, the stop pattern of the clock signal SCL and the data signal SDA occurs (Step S284). Meanwhile, the second stop detector 242 is enabled (Step S275). Consequently, the fourth output signal P2 is switched from the low level state to the high level state.

At the time point td corresponding to the positive edge of the clock signal SCL, the fourth resetter 248 is enabled (Step S286). Meanwhile, the fourth control signal Ctrl4 is switched from the low level state to the high level state. Moreover, the fourth control signal Ctrl4 is transmitted to the second stop detector 242 through the OR gate 246. Meanwhile, the second stop detector 242 is reset, and the fourth output signal P2 is switched from the high level state to the low level state. Since the third output signal P1 is in the low level state, the first stop detector 232 releases the third resetter 236 (Step S286).

Then, the subsequent operation is performed according to the result of judging whether the stop pattern of the clock signal SCL and the data signal SDA occurs (Step S287).

The operations of the first stop detecting circuit and the second stop detecting circuit have been described as above. When the stop pattern of the clock signal SCL and the data signal SDA occurs, the cooperation of the OR gate 260 and the output signals P1, P2 can generate the stop signal STOP to indicate the stop pattern and the repeat stop patterns of the clock signal SCL and the data signal SDA.

From the above descriptions, the present invention provides above descriptions, the present invention provides a start-and-stop detecting apparatus and a start-and-stop detecting method for an $I^3C$ bus. When the start pattern and the stop pattern of the clock signal SCL and the data signal SDA occur, the start-and-stop detecting apparatus generates the start signal START and the stop signal STOP. Consequently, the slave device connected with the $I^3C$ bus can be operated normally.

Moreover, since the $I^3C$ bus retains the upward compatibility with the existing $I^2C$ bus, the start-and-stop detecting apparatus of the present invention can be applied to the slave device that is connected with the $I^2C$ bus.

It is noted that numerous modifications and alterations may be made while retaining the teachings of the invention. For example, in another embodiment, the start-and-stop detecting apparatus of the slave device uses the first start detecting circuit 210 and the second start detecting circuit 220 to generate the start signal START and uses another circuit to generate the stop signal STOP. Alternatively, the start-and-stop detecting apparatus of the slave device uses the first stop detecting circuit 230 and the second stop detecting circuit 240 to generate the stop signal and uses another circuit to generate the start signal START.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A start-and-stop detecting apparatus for an $I^3C$ bus, the start-and-stop detecting apparatus being connected with a serial data line and a serial clock line, the start-and-stop detecting apparatus comprising:

a first start detecting circuit receiving a data signal from the serial data line, a clock signal from the serial clock line and a reset signal from a reset line, and generating a first control signal and a first output signal, wherein the first control signal is different from the first output signal;

a second start detecting circuit receiving the data signal from the serial data line, the clock signal from the serial clock line, the reset signal from the reset line and the first control signal from the first start detecting circuit, and generating a second output signal; and a first OR gate, wherein a first input terminal of the first OR gate receives the first output signal, a second input terminal of the first OR gate receives the second output signal, and an output terminal of the first OR gate generates a start signal.

2. The start-and-stop detecting apparatus as claimed in claim 1, further comprising:

a first stop detecting circuit receiving the data signal, the clock signal and the reset signal, and generating a second control signal and a third output signal;

a second stop detecting circuit receiving the data signal, the clock signal, the reset signal and the second control signal, and generating a fourth output signal; and a second OR gate, wherein a first input terminal of the second OR gate receives the third output signal, a second input terminal of the second OR gate receives the fourth output signal, and an output terminal of the second OR gate generates a stop signal.

3. The start-and-stop detecting apparatus as claimed in claim 2, wherein the first start detecting circuit comprises:

a first start detector, wherein a data input terminal of the first start detector receives the clock signal, a clock input terminal of the first start detector receives the data signal, and a data output terminal of the first start detector generates the first output signal;

a first resetter, wherein a data input terminal of the first resetter receives the first output signal, a clock input terminal of the first resetter receives the clock signal, a data output terminal of the first resetter generates the first control signal, and a reset terminal of the first resetter receives the reset signal; and a third OR gate, wherein a first input terminal of the third OR gate receives the reset signal, a second input terminal of the third OR gate receives the first control signal, and an output terminal of the third OR gate is connected with a reset terminal of the first start detector.

4. The start-and-stop detecting apparatus as claimed in claim 3, wherein the second start detecting circuit comprises:

a first AND gate, wherein a first input terminal of the first AND gate receives the clock signal, and a second input terminal of the first AND gate receives the first control signal;

a second start detector, wherein a data input terminal of the second start detector is connected with an output terminal of the first AND gate, a clock input terminal of the second start detector receives the data signal, and a data output terminal of the second start detector generates the second output signal;

a second resetter, wherein a data input terminal of the second resetter receives the second output signal, a clock input terminal of the second resetter receives the clock signal, a data output terminal of the second resetter generates a third control signal, and a reset terminal of the second resetter receives the reset signal; and a fourth OR gate, wherein a first input terminal of the fourth OR gate receives the reset signal, a second input terminal of the fourth OR gate receives the third control signal, and an output terminal of the fourth OR gate is connected with a reset terminal of the second start detector.

5. The start-and-stop detecting apparatus as claimed in claim 4, wherein the first stop detecting circuit comprises:

a first stop detector, wherein a data input terminal of the first stop detector receives the clock signal, a clock input terminal of the first stop detector receives the data signal, and a data output terminal of the first stop detector generates the third output signal;

a third resetter, wherein a data input terminal of the third resetter receives the third output signal, a clock input terminal of the third resetter receives the clock signal, a data output terminal of the third resetter generates the second control signal, and a reset terminal of the third resetter receives the reset signal; and a fifth OR gate, wherein a first input terminal of the fifth OR gate receives the reset signal, a second input terminal of the fifth OR gate receives the second control signal, and an output terminal of the fifth OR gate is connected with a reset terminal of the first stop detector.

6. The start-and-stop detecting apparatus as claimed in claim 5, wherein the second stop detecting circuit comprises:

a second AND gate, wherein a first input terminal of the second AND gate receives the clock signal, and a second input terminal of the second AND gate receives the second control signal;

a second stop detector, wherein a data input terminal of the second stop detector is connected with an output terminal of the second AND gate, a clock input terminal of the second stop detector receives the data signal, and a data output terminal of the second stop detector generates the fourth output signal;

a fourth resetter, wherein a data input terminal of the fourth resetter receives the fourth output signal, a clock input terminal of the fourth resetter receives the clock signal, a data output terminal of the fourth resetter generates a fourth control signal, and a reset terminal of the fourth resetter receives the reset signal; and a sixth OR gate, wherein a first input terminal of the sixth OR gate receives the reset signal, a second input terminal of the sixth OR gate receives the fourth control signal, and an output terminal of the sixth OR gate is connected with a reset terminal of the second stop detector.

7. The start-and-stop detecting apparatus as claimed in claim 6, wherein the first stop detector, the second stop detector, the first resetter, the second resetter, the third resetter and the fourth resetter are positive edge-triggered D flip-flops.

8. The start-and-stop detecting apparatus as claimed in claim 4, wherein the first start detector and the second start detector are negative edge-triggered D flip-flops.

9. A start detecting method for a detecting apparatus, the detecting apparatus being connected with an $I^3C$ bus, the detecting apparatus comprising a first start detector, a first resetter, a second start detector and a second resetter to receive a clock signal and a data signal, the start detecting method comprising steps of:

(a1) detecting the clock signal and the data signal;

(a2) judging whether a start pattern of the clock signal and the data signal occur, wherein if the start pattern of the clock signal and the data signal occurs, the first start detector is enabled, wherein if the start pattern of the clock signal and the data signal does not occur, the step (a1) is repeatedly done;

(a3) enabling the first resetter, and releasing the second resetter by the second start detector;

(a4) judging whether the start pattern of the clock signal and the data signal occur, wherein if the start pattern of the clock signal and the data signal occurs, the second start detector is enabled, wherein if the start pattern of the clock signal and the data signal does not occur, the first resetter is released by the first start detector and the step (a1) is repeatedly done;

(a5) enabling the second resetter, and releasing the first resetter by the first start detector; and (a6) judging whether the start pattern of the clock signal and the data signal occur, wherein if the start pattern of the clock signal and the data signal occurs, the first start detector is enabled and the step (a3) is repeatedly done, wherein if the start pattern of the clock signal and the data signal does not occur, the second resetter is released by the second start detector and the step (a1) is repeatedly done.

10. The start detecting method as claimed in claim 9, wherein when the first start detector is enabled, a start signal is switched from a low level state to a high level state, wherein when the first resetter is enabled, the start signal is switched from the high level state to the low level state, wherein when the second start detector is enabled, the start signal is switched from the low level state to the high level state, wherein when the second resetter is enabled, the start signal is switched from the high level state to the low level state.

11. A stop detecting method for a detecting apparatus, the detecting apparatus being connected with an I$^3$C bus, the detecting apparatus comprising a first stop detector, a first resetter, a second stop detector and a second resetter to receive a clock signal and a data signal, the stop detecting method comprising steps of:

(b1) detecting the clock signal and the data signal;

(b2) judging whether a stop pattern of the clock signal and the data signal occur, wherein if the stop pattern of the clock signal and the data signal occurs, the first stop detector is enabled, wherein if the stop pattern does not occur, the step (b1) is repeatedly done;

(b3) enabling the first resetter, and releasing the second resetter by the second stop detector;

(b4) judging whether the stop pattern of the clock signal and the data signal occur, wherein if the stop pattern of the clock signal and the data signal occurs, the second stop detector is enabled, wherein if the stop pattern of the clock signal and the data signal does not occur, the first resetter is released by the first stop detector and the step (b1) is repeatedly done;

(b5) enabling the second resetter, and releasing the first resetter by the first stop detector; and (b6) judging whether the stop pattern of the clock signal and the data signal occur, wherein if the stop pattern of the clock signal and the data signal occurs, the first stop detector is enabled and the step (b3) is repeatedly done, wherein if the stop pattern of the clock signal and the data signal does not occur, the second resetter is released by the second stop detector and the step (b1) is repeatedly done.

12. The start detecting method as claimed in claim 11, wherein when the first stop detector is enabled, a stop signal is switched from a low level state to a high level state, wherein when the first resetter is enabled, the stop signal is switched from the high level state to the low level state, wherein when the second stop detector is enabled, the stop signal is switched from the low level state to the high level state, wherein when the second resetter is enabled, the stop signal is switched from the high level state to the low level state.

* * * * *